(12) United States Patent
Kyosaki

(10) Patent No.: US 12,656,377 B2
(45) Date of Patent: Jun. 16, 2026

(54) CURRENT MEASUREMENT MODULE

(71) Applicant: Asahi Kasei Microdevices Corporation, Tokyo (JP)

(72) Inventor: Taiga Kyosaki, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 142 days.

(21) Appl. No.: 18/619,166

(22) Filed: Mar. 28, 2024

(65) Prior Publication Data

US 2024/0345140 A1 Oct. 17, 2024

(30) Foreign Application Priority Data

Mar. 31, 2023 (JP) ................................ 2023-059252

(51) Int. Cl.
| | |
|---|---|
| *G01R 33/00* | (2006.01) |
| *G01R 19/00* | (2006.01) |
| *G01R 33/07* | (2006.01) |

(52) U.S. Cl.
CPC ..... *G01R 19/0092* (2013.01); *G01R 33/0005* (2013.01); *G01R 33/072* (2013.01)

(58) Field of Classification Search
CPC ............ G01R 19/0092; G01R 33/0005; G01R 33/072; G01R 15/207; G01R 15/202; G01R 15/205
USPC ....................................................... 324/76.11
See application file for complete search history.

(56) References Cited

U.S. PATENT DOCUMENTS

| | | | | |
|---|---|---|---|---|
| 6,459,255 B1 * | 10/2002 | Tamai | .................. | G01R 15/202 |
| | | | | 324/117 R |
| 6,512,359 B1 * | 1/2003 | Tamai | .................. | G01R 15/207 |
| | | | | 324/117 R |
| 8,330,453 B2 * | 12/2012 | Hotz | .................... | G01R 15/207 |
| | | | | 324/207.2 |
| 10,215,780 B2 * | 2/2019 | Shimizu | ................. | G01R 15/20 |
| 10,267,825 B2 * | 4/2019 | Sakaguchi | ........... | G01R 15/146 |

(Continued)

FOREIGN PATENT DOCUMENTS

| | | |
|---|---|---|
| DE | 102021119837 A1 | 2/2023 |
| JP | 2002277491 A | 9/2002 |

(Continued)

*Primary Examiner* — Christopher P McAndrew

(57) ABSTRACT

Solution: Provided is a current measurement module comprising: a conductor comprising two main body portions and two current paths having cross-sectional areas different from each other, wherein the two current paths are disposed between the two main body portions and extend in parallel to each other with a gap provided therebetween; two magnetic field sensing elements which each have a magnetosensitive surface disposed such that magnetic fields generated by currents flowing through the two current paths penetrate through the magnetosensitive surface in opposite directions to each other; and a substrate which supports the two magnetic field sensing elements and is attached to the conductor, wherein the substrate is inserted into the gap, and a distance between the two magnetic field sensing elements and an inner end of a current path of the two current paths having a smaller cross-sectional area is smaller than a distance between the two magnetic field sensing elements and an inner end of a current path of the two current paths having a larger cross-sectional area.

15 Claims, 25 Drawing Sheets

(56)                References Cited

U.S. PATENT DOCUMENTS

| | | | | |
|---|---|---|---|---|
| 11,366,141 | B1 * | 6/2022 | Daubert | G01R 15/207 |
| 11,402,409 | B1 * | 8/2022 | McNally | G01R 15/207 |
| 2007/0279053 | A1 * | 12/2007 | Taylor | G01R 33/07 |
| | | | | 324/252 |
| 2008/0094060 | A1 | 4/2008 | Muraki | |
| 2008/0186021 | A1 | 8/2008 | Hashio | |
| 2010/0045286 | A1 * | 2/2010 | Hotz | G01R 15/207 |
| | | | | 324/260 |
| 2011/0221430 | A1 | 9/2011 | Ito | |
| 2013/0187633 | A1 | 7/2013 | Yasui | |
| 2013/0214593 | A1 | 8/2013 | Ohashi | |
| 2013/0320968 | A1 | 12/2013 | Sakamoto | |
| 2014/0097826 | A1 * | 4/2014 | Hebiguchi | G01R 15/202 |
| | | | | 324/117 R |
| 2014/0103918 | A1 | 4/2014 | Nomura | |
| 2014/0320122 | A1 * | 10/2014 | Fukui | G01R 15/207 |
| | | | | 324/244 |
| 2015/0123650 | A1 * | 5/2015 | Matsue | G01R 19/0092 |
| | | | | 324/144 |
| 2015/0204916 | A1 | 7/2015 | Akimoto | |
| 2015/0204919 | A1 * | 7/2015 | Akimoto | G01R 15/207 |
| | | | | 324/244 |
| 2015/0245534 | A1 | 8/2015 | Seo | |
| 2017/0003323 | A1 | 1/2017 | Nakayama | |
| 2017/0082659 | A1 | 3/2017 | Harada | |
| 2017/0212153 | A1 | 7/2017 | Tsujimoto | |
| 2017/0343584 | A1 | 11/2017 | Abe | |
| 2018/0306842 | A1 * | 10/2018 | Fukunaka | G01R 15/202 |
| 2019/0187183 | A1 * | 6/2019 | Okuyama | G01R 19/0092 |
| 2019/0293733 | A1 | 9/2019 | Esaka | |
| 2020/0011902 | A1 | 1/2020 | Shimizu | |
| 2020/0256897 | A1 | 8/2020 | Fujimori | |
| 2021/0080489 | A1 * | 3/2021 | Koizumi | G01R 15/207 |
| 2021/0285794 | A1 * | 9/2021 | Briano | G01R 33/075 |
| 2021/0311136 | A1 | 10/2021 | Augendre | |
| 2022/0091161 | A1 | 3/2022 | Houis | |
| 2022/0163571 | A1 * | 5/2022 | Ito | G01R 15/205 |
| 2023/0092098 | A1 * | 3/2023 | Tamura | G01R 15/207 |
| | | | | 324/117 R |

FOREIGN PATENT DOCUMENTS

| | | |
|---|---|---|
| JP | 2005283451 A | 10/2005 |
| JP | 2008216230 A | 9/2008 |
| JP | 2013170878 A | 9/2013 |
| JP | 2014055790 A | 3/2014 |
| JP | 2016121960 A | 7/2016 |
| JP | 2018185225 A | 11/2018 |
| JP | 2022158768 A | 10/2022 |

* cited by examiner

10

<CASE 1>

10a

<CASE 2>

10b

<CASE 3>

| MAXIMUM TEMPERATURE | | | MAGNETIC FLUX DENSITY | | |
|---|---|---|---|---|---|
| CASE 1 | CASE 2 | CASE 3 | CASE 1 | CASE 2 | CASE 3 |
| 592°C | 675°C | 757°C | 0.745mT | 0.639mT | 0.723mT |

<CASE 4>

10d

<CASE 5>

10e

<CASE 6>

10g

<CASE 8>

10o

10o

CURRENT MEASUREMENT MODULE

BACKGROUND

1. Technical Field

The present invention relates to a current measurement module.

2. Related Art

Patent document 1 discloses "a current sensor comprising a conductive busbar to which a taper is formed". Patent document 2 discloses "a coreless type current detection device that suppresses an influence of an external magnetic field and maintains excellent frequency characteristics up to high-frequency regions".

PRIOR ART DOCUMENT

Patent Document

Patent Document 1: DE 102021119837 A1
Patent Document 2: Japanese Patent Application Publication No. 2022-158768

SUMMARY

In a first aspect of the present invention, provided is a current measurement module. The current measurement module may include a conductor including two main body portions and two current paths having cross-sectional areas different from each other, wherein the two current paths are disposed between the two main body portions and extend in parallel to each other with a gap provided therebetween. The current measurement module may include two magnetic field sensing elements which each have a magnetosensitive surface disposed such that magnetic fields generated by currents flowing through the two current paths penetrate through the magnetosensitive surface in opposite directions to each other. The current measurement module may include a substrate which supports the two magnetic field sensing elements and is attached to the conductor. The substrate may be inserted into the gap. A distance between the two magnetic field sensing elements and an inner end of a current path of the two current paths having a smaller cross-sectional area may be smaller than a distance between the two magnetic field sensing elements and an inner end of a current path of the two current paths having a larger cross-sectional area.

Each of the two current paths may be disposed farther inward than outer edges of the two main body portions in a direction in which the two current paths are aligned.

The two main body portions may include slits, respectively, which extend from the gap and are narrower than the gap.

Each of the slits may have a tapered portion tapering from a side adjacent to the two current paths to a side adjacent to the two main body portions.

The substrate may be inserted into the gap and the slits.

The substrate may be inserted into the gap and the slits, and at least a part of the substrate may contact with an edge of each of the slits.

The slits may be disposed farther inward than outer edges of the gap in a direction in which the two current paths are aligned.

The gap and the slits may constitute an opening having a T-shape.

The two magnetic field sensing elements may be arranged on a surface on the substrate facing the current path having the smaller cross-sectional area.

Each of the two main body portions may include a first extending portion extending in a direction orthogonal to a direction in which currents flow through the two current paths.

The first extending portion of each of the two main body portions may extend in opposite directions to each other.

At least one of the two main body portions may further include a second extending portion further extending from the first extending portions, and the second extending portion may extend in a direction orthogonal to a plane in which the two main body portions are arranged.

The two current paths may have same thicknesses and different widths.

A ratio of the distance between the two magnetic field sensing elements and the inner end of the current path having the smaller cross-sectional area to the distance between the two magnetic field sensing elements and the inner end of the current path having the larger cross-sectional area may be within a range from 6:7 to 6:11.

A ratio of a cross-sectional area of the current path having the smaller cross-sectional area to a cross-sectional area of the current path having the larger cross-sectional area may be within a range from 5:6 to 5:11.

The summary clause does not necessarily describe all necessary features of the embodiments of the present invention. The present invention may also be a sub-combination of the features described above.

BRIEF DESCRIPTION OF THE DRAWINGS

FIG. 6 is a table representing a maximum temperature during applying a direct current of 1,000 A and a magnetic flux density during applying the direct current of 100 A for the current measuring conductors of Case 1 to Case 3.

DESCRIPTION OF EXEMPLARY EMBODIMENTS

Hereinafter, the present invention will be described through embodiments of the invention, but the following embodiments do not limit the invention according to claims. In addition, not all of the combinations of features described in the embodiments are imperative to the solving means of the invention.

Configuration of First Embodiment

Figure 1:
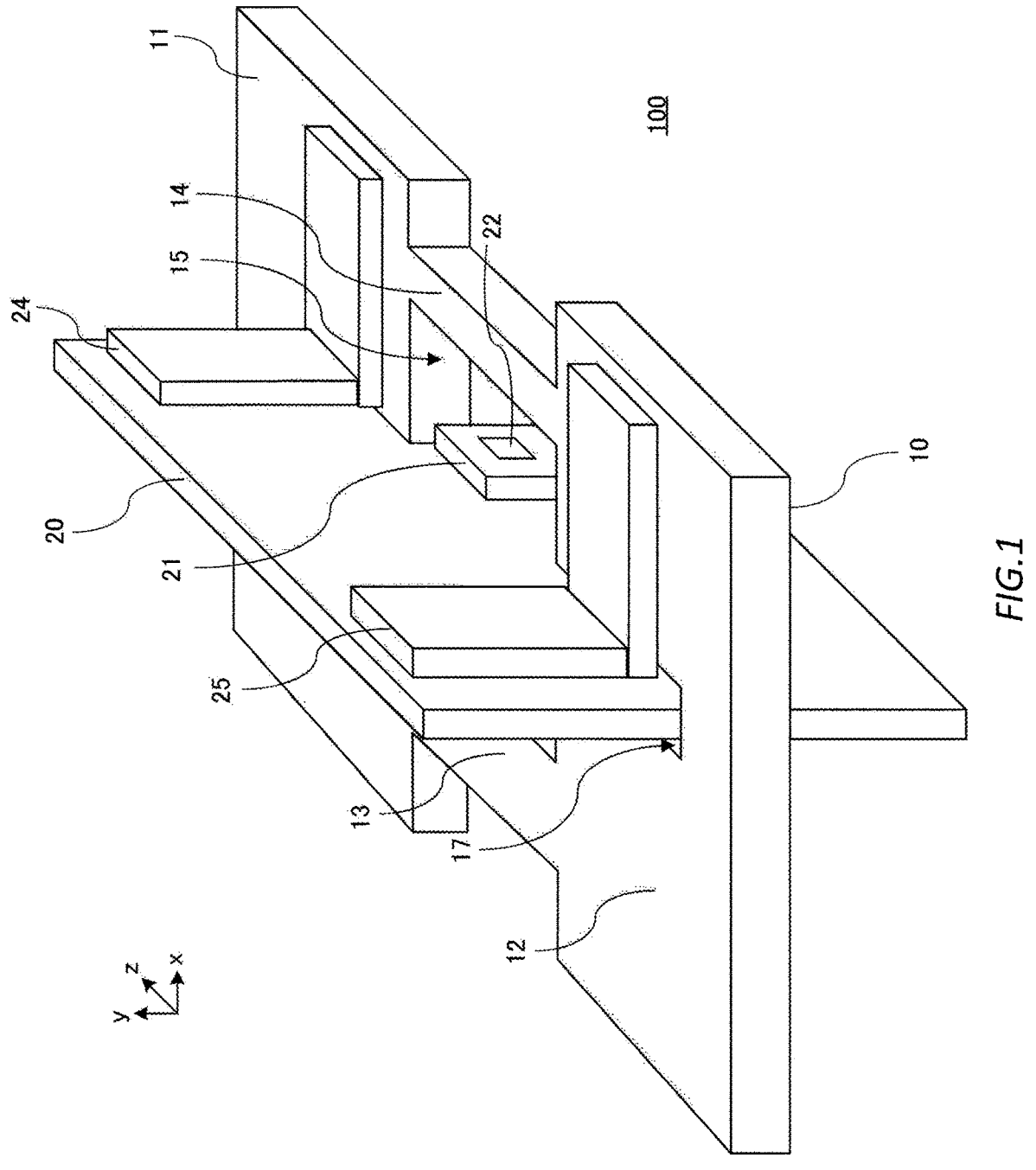
FIG. 1 is a perspective view illustrating an example of a schematic configuration of a current measurement module 100 in a first embodiment.
Figure 2:
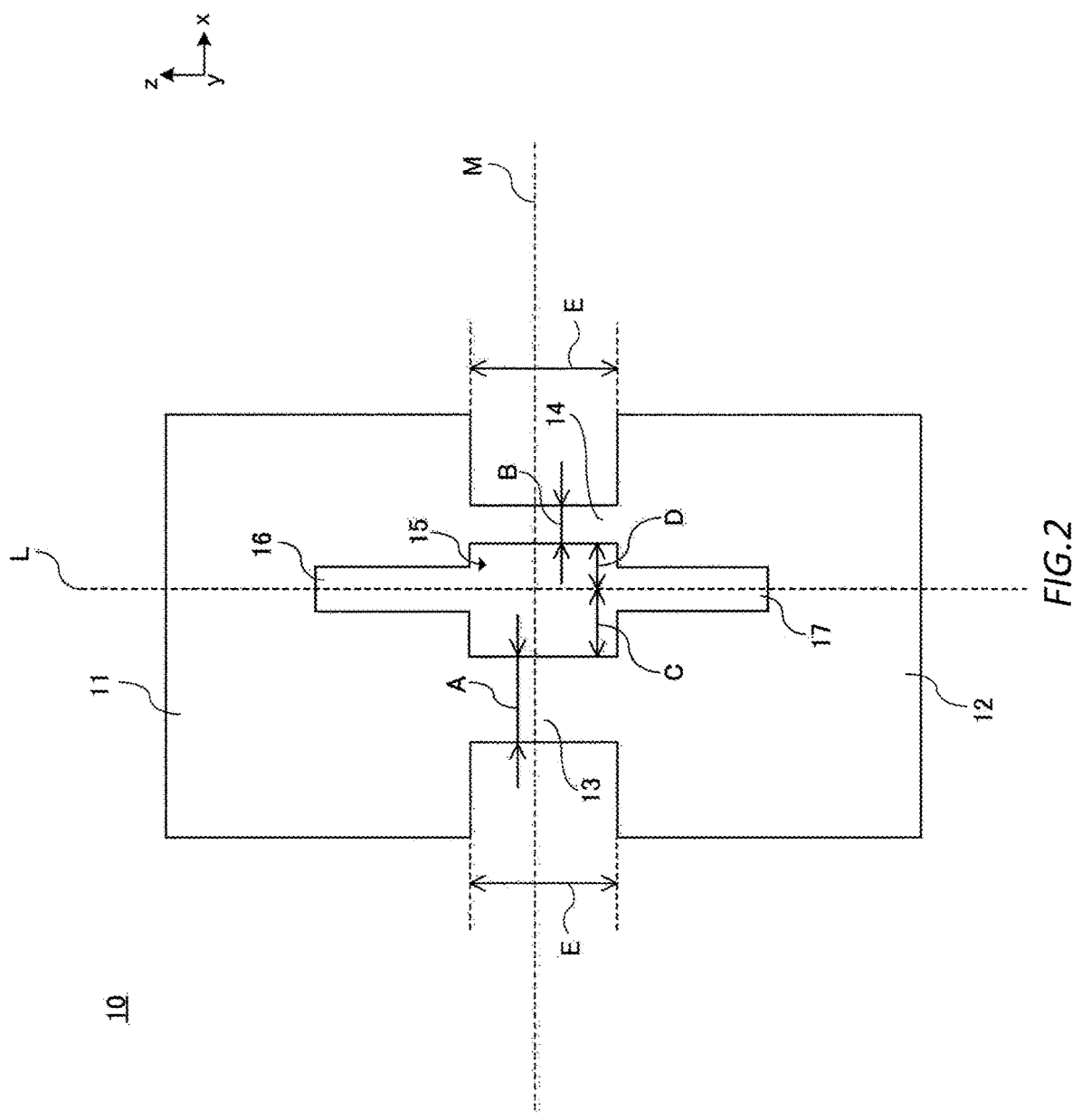
FIG. 2 is a top view illustrating an example of a schematic configuration of a current measuring conductor 10 in the first embodiment.
Figure 3A:
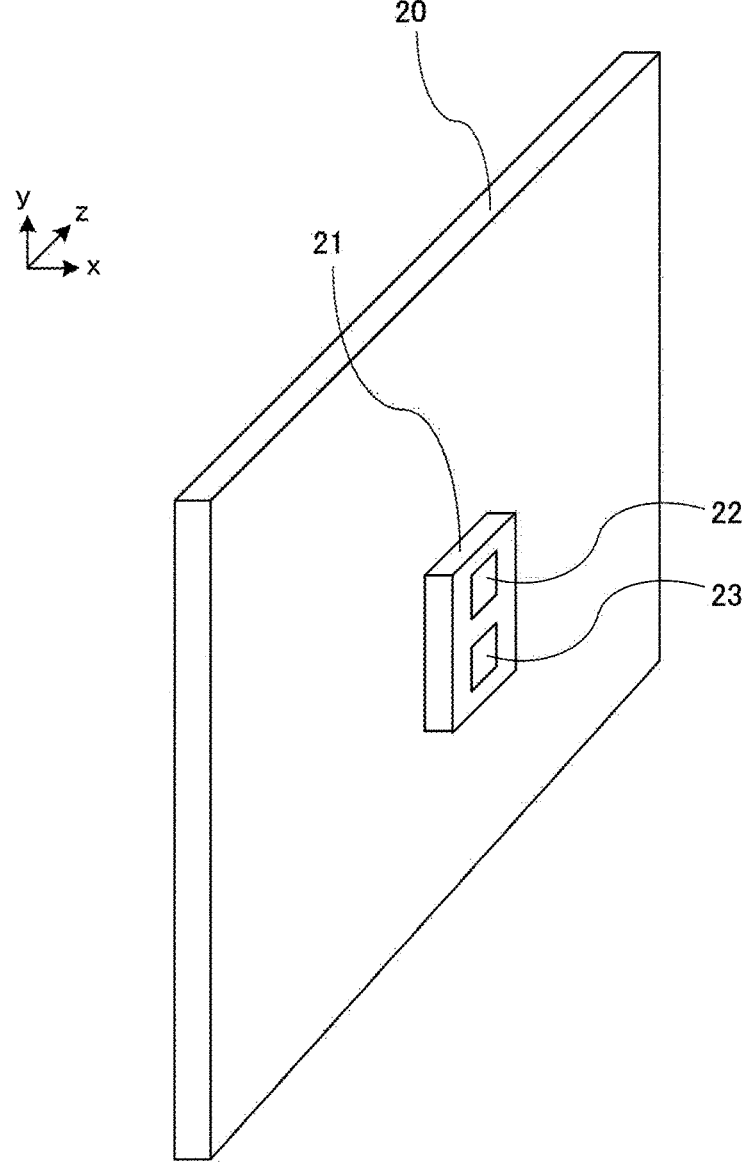
FIG. 3A is a perspective view illustrating an example of a schematic configuration of a substrate 20 in the first embodiment.
Figure 3B:
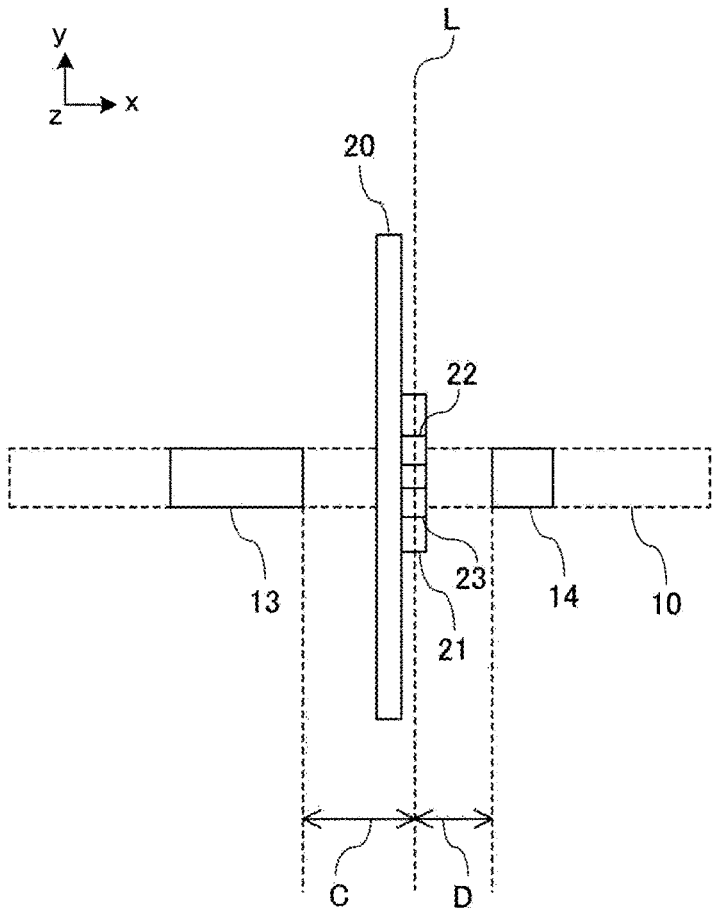
FIG. 3B is a cross-sectional view of FIG. 2 in a position of a dashed line M.

FIG. 1 is a perspective view illustrating an example of a schematic configuration of a current measurement module 100 according to a first embodiment. FIG. 2 is a top view illustrating an example of a schematic configuration of a current measuring conductor 10 in the first embodiment. FIG. 3A is a perspective view illustrating an example of a schematic configuration of a substrate 20 in the first embodiment, and FIG. 3B is a view illustrating a position relationship between magnetic field sensing elements 22 and 23. In each drawing, an xyz coordinate system is illustrated. As illustrated in FIG. 1, the current measurement module 100 includes a current measuring conductor 10 and a substrate 20.

As illustrated in FIG. 2, the current measuring conductor 10 includes two main body portions 11 and 12 and two current paths 13 and 14. The two current paths 13 and 14 are disposed between the two main body portions 11 and 12 and extend in parallel to each other. A gap 15 is disposed between the two current paths 13 and 14. The two main body portions 11 and 12 include slits 16 and 17, respectively, which extend from the gap 15 and are narrower than the gap 15. Note that the current measuring conductor 10 is also called as a busbar.

A current to be measured flows through each of the two current paths 13 and 14 in a same direction. In the present embodiment, the two current paths 13 and 14 are conductors having a transverse cross-sectional shape of rectangular and extending linearly. Note that the transverse cross-sectional shape of the two current paths 13 and 14 may be any shape such as circle or ellipse. Each of the two current paths 13 and 14 is disposed farther inward than outer edges of the two main body portions 11 and 12 in a direction in which the two current paths 13 and 14 are aligned. A length E of each of the two current paths 13 and 14 in a z direction is 10 mm.

The two current paths 13 and 14 have cross-sectional areas different from each other. In the first embodiment, the two current paths 13 and 14 have same thicknesses and different widths A and B, respectively. Here, A>B, that is, the width B of the current path 14 is smaller than the width A of the current path 13. In the first embodiment, the width A of the current path 13 in an x direction is 4.5 mm and the width B of the current path 14 in the x direction is 2.5 mm. Therefore, the current measuring conductor 10 has an asymmetrical shape.

A dashed line L in FIG. 2 indicates the positions of the two magnetic field sensing elements 22 and 23 fixed to the substrate 20 in the x direction. That is, the two magnetic field sensing elements 22 and 23 are arranged so as to be positioned on the dashed line L. As illustrated in FIG. 2, a distance between the two magnetic field sensing elements 22 and 23 and an inner end of the current path 13 is C, and a distance between the two magnetic field sensing elements 22 and 23 and an inner end of the current path 14 is D. In the first embodiment, the distance C is 4.5 mm, and the distance D is 3.5 mm. That is, the distance D between the two magnetic field sensing elements 22 and 23 and the inner end of the current path 14 is smaller than the distance C between the two magnetic field sensing elements 22 and 23 and the inner end of the current path 13. In other words, the two magnetic field sensing elements 22 and 23 are arranged so as to be closer to the current path 14 having the smaller width.

As illustrated in FIG. 3A, the two magnetic field sensing elements 22 and 23 are encapsulated in a package 21 and fixed to the substrate 20. The package 21 is provided with lead terminals for driving the magnetic field sensing elements 22 and 23 and extracting signals from the magnetic field sensing elements 22 and 23. As the package 21, an IC mold package or the like can be used. In the current measurement module 100 illustrated in FIG. 1, the two magnetic field sensing elements 22 and 23 are disposed above and below the gap 15, respectively, with the gap interposed therebetween.

FIG. 3B is a cross-sectional view of FIG. 2 in a position of a dashed line M. As illustrated in FIG. 3B, the magnetic field sensing elements 22 and 23 are arranged so as to be positioned on the dashed line L. Therefore, a distance between the dashed line L and the inner end of the current path 13 is C (4.5 mm), and a distance between the dashed line L and the inner end of the current path 14 is D (3.5 mm).

Each of the magnetic field sensing elements 22 and 23 detects strength (magnitude) of a magnetic field generated on each magnetosensitive surface by the current to be measured flowing through each of the two current paths 13 and 14 and outputs a detection signal depending on this detected strength. Each of the magnetic field sensing elements 22 and 23 is arranged such that the magnetic fields generated by the currents to be measured flowing through the two current paths 13 and 14, respectively, in the same direction penetrate through the magnetosensitive surfaces in opposite directions to each other. That is, the magnetic field sensing elements 22 and 23 are arranged between the two current paths 13 and 14 such that orientations of the magnetosensitive surfaces coincide with each other. In the examples of FIG. 3A and FIG. 3B, the orientations of the magnetosensitive surfaces, that is, the normal directions of said surfaces are a +x direction.

As the magnetic field sensing elements 22 and 23, a magnetoelectric conversion element can be used, and as the magnetoelectric conversion element, for example, a Hall element capable of obtaining a detection signal proportional to a magnitude of a magnetic flux density can be used. Note that as the magnetoelectric conversion element, an MR element (magnetoresistive element), an MI element (magnetic impedance element), or the like may be used in addition to the Hall element. Furthermore, any element with which a detection signal is uniquely determined for an applied magnetic flux density, such as a magnetic sensor IC obtained by combining these magnetoelectric conversion elements and an IC processing circuit, can be used as the magnetic field sensing elements 22 and 23.

As illustrated in FIG. 1, the substrate 20 supporting the two magnetic field sensing elements 22 and 23 is inserted into the gap 15 in the current measuring conductor 10 and into the two slits 16 and 17 extending from the gap 15. The two magnetic field sensing elements 22 and 23 are provided on a surface of the substrate 20 facing the current path 14. The inserted substrate 20 is attached and fixed to the current measuring conductor 10 by means of two fixing portions 24 and 25. The fixing portion 24 fixes the substrate 20 to the current measuring conductor 10 at a position corresponding to the slit 16. The fixing portion 25 fixes the substrate 20 to the current measuring conductor 10 at a position corresponding to the slit 17. A shape of each of the two slits 16 and 17 illustrated in the figure is rectangular, although each of the slits may have a tapered portion tapering from a side adjacent to the two current paths 13 and 14 to a side adjacent to the two main body portions 11 and 12. The two slits 16 and 17 may be disposed farther inward than outer edges of the gap in the direction in which the two current paths are aligned.

As described above, in the current measurement module 100 in the first embodiment, the two main body portions 11 and 12 include the current path 13 having the larger width and the current path 14 having the smaller width, and the two magnetic field sensing elements 22 and 23 are arranged so as to be closer to the current path 14 having the smaller width. Such configuration is designed considering comprehensively (A) exothermic characteristics, (B) frequency characteristics, and (C) magnetic characteristics in the current measurement module 100.

Note that, when measuring a current flowing through a current path, a magnitude of the current to be measured may not be measured accurately due to an influence of the skin effect. To reduce the influence of the skin effect, there are the following two means. First, making a cross-sectional area of the current path smaller can reduce a relative difference between: a distance between a surface of a conductor having the higher current density and a magnetic field sensing element; and a distance between a core of the conductor having the lower current density and the magnetic field sensing element, thereby reducing the influence of the skin effect. That is, if the cross-sectional area of the current path is sufficiently small with respect to a skin depth at a frequency expected to be used, the current will also flow through near the middle of the current path, which is substantially equivalent to not being subject to the influence of the skin effect. Therefore, the influence of the skin effect is suppressed as the current path gets narrower.

Second, making the distance between the current path and the magnetic field sensing element farther can reduce the relative difference between: the distance between the surface of the current path having the higher current density and the magnetic field sensing element; and the distance between the core of the current path having the lower current density and the magnetic field sensing element, thereby reducing the influence of the skin effect. That is, if the distance between the magnetic field sensing element and the current path is sufficiently farther, even when the current flows further outer side of the current path at a higher frequency than at the lower frequency, a difference in positions at which the current flows due to this is smaller than the distance between the magnetic field sensing element and the current path, thereby suppressing the influence of the skin effect. Therefore, the influence of the skin effect is suppressed as the distance between the current path and the magnetic field sensing element gets farther.

(A) From the perspective of the exothermic characteristics, there is a demand for a thicker and shorter current path, since the resistance value decreases and the generation of heat is suppressed as the current path gets thicker and shorter. (B) From the perspective of the frequency characteristics, there is a demand for a narrower current path, since the influence of the skin effect is suppressed as the current path gets narrower. Furthermore, there is a demand for a farther distance between the magnetic field sensing elements 22 and 23 and the current path, since the influence of the skin effect is suppressed as the distance between the magnetic field sensing elements 22 and 23 and the current path gets farther. (C) From the perspective of the magnetic characteristics, there is a demand for a narrower current path, since the detected magnetic flux density becomes greater and the gain when detecting magnetism is suppressed as the current path gets narrower. Furthermore, there is a demand for a closer distance between the magnetic field sensing elements 22 and 23 and the current path, since the detected magnetic flux density becomes greater as the distance between the magnetic field sensing elements 22 and 23 and the current path gets closer.

As described above, for the current path, there are the demand for the thicker one and the demand for the narrower one, and for the distance between the magnetic field sensing elements 22 and 23 and the current path, there are the demand for the farther one and the demand for the closer one, so there is tradeoff relationships between them, respectively. Considering the tradeoff relationships as described above, it is required to make (A) the exothermic characteristics, (B) the frequency characteristics, and (C) the magnetic characteristics optimal.

Considering the respective characteristics described above, in the present embodiment, by making the one current path narrow and making the other current path thick, the heat generation can be prevented by increasing the width of the other current path, while the influence of the skin effect can be suppressed by making the one current narrower. In addition, since the narrower current path is subject to less influence of the skin effect, by bringing the narrower current path closer to the magnetic field sensing elements 22 and 23, the magnetic flux density detected at the current path less susceptible to the skin effect can be increased. And, since the thicker current path is subject to a greater influence of the skin effect, by bringing the thicker current path farther from the magnetic field sensing elements 22 and 23, the influence of the skin effect can be reduced.

Figure 4A:
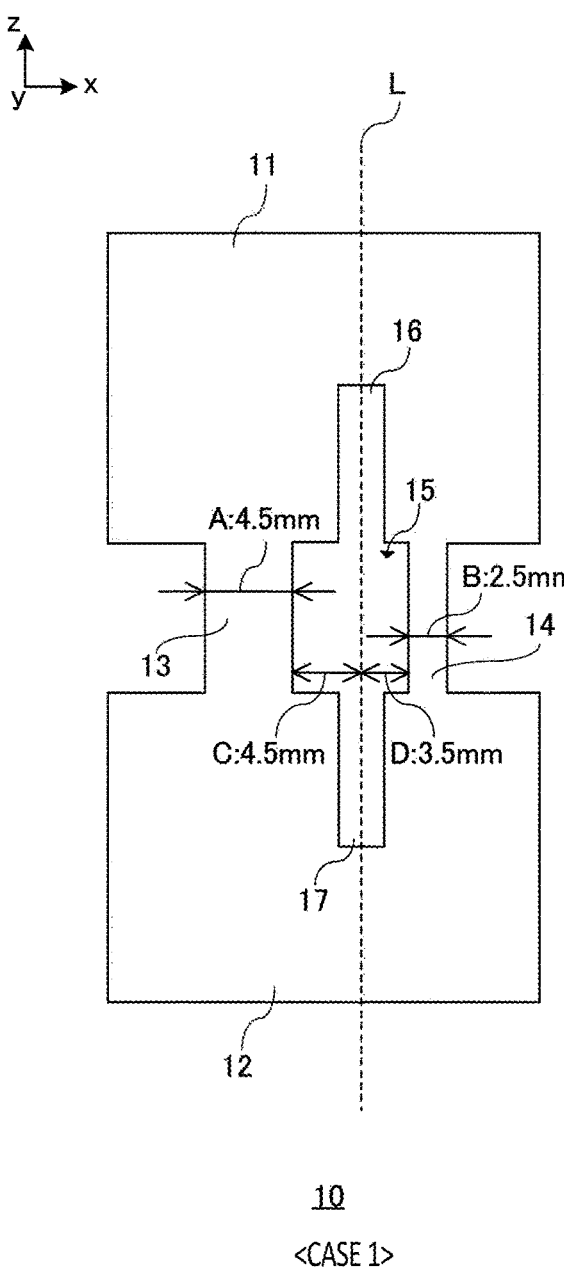
FIG. 4A represents a current measuring conductor of Case 1.
Figure 4B:
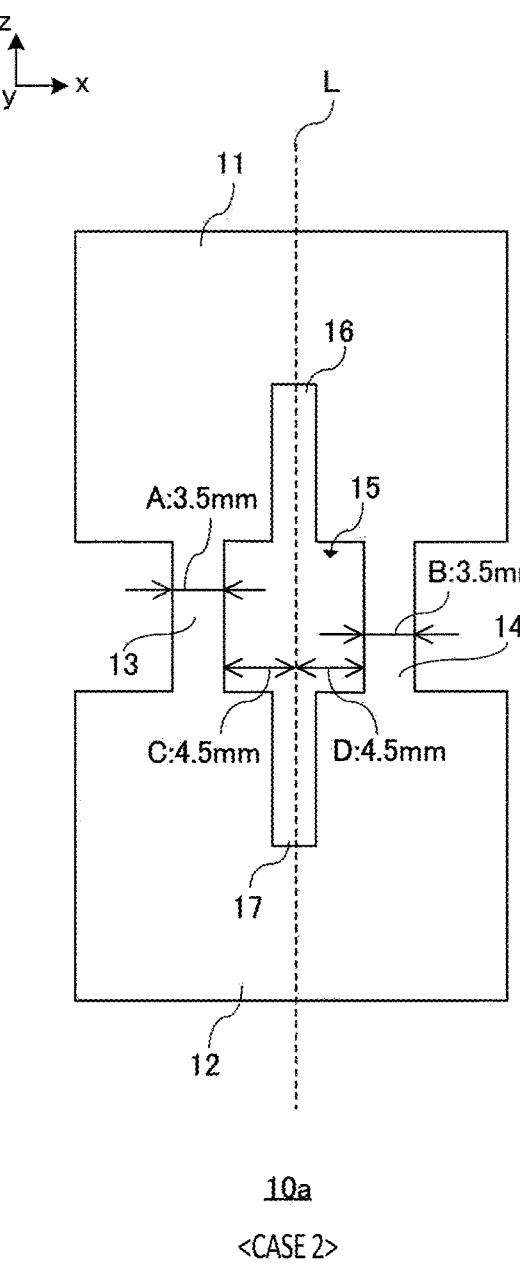
FIG. 4B represents a current measuring conductor of Case 2.
Figure 4C:
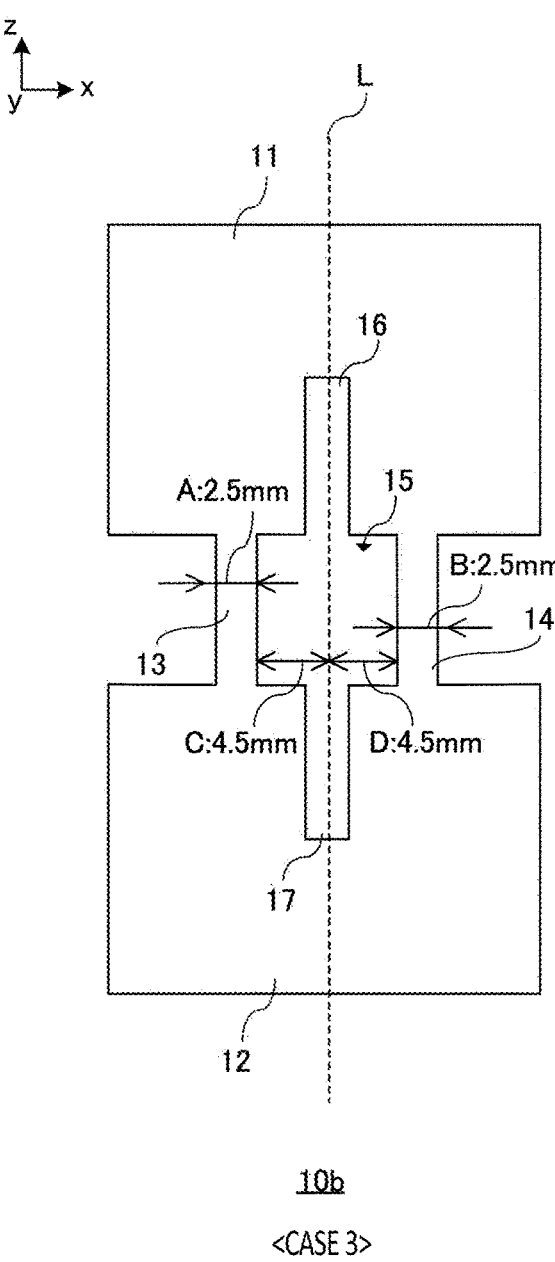
FIG. 4C represents a current measuring conductor of Case 3.

FIGS. 4A to 4C represent current measuring conductors of Case 1 to Case 3. Case 1 represents a schematic configuration of the current measuring conductor 10 in the first embodiment, Case 2 represents a schematic configuration of a current measuring conductor 10a in a first comparative example, and Case 3 represents a schematic configuration of a current measuring conductor 10b in a second comparative example. Although not illustrated in FIGS. 4A to 4C, in all of the cases, the substrate 20 equipped with the two magnetic field sensing elements 22 and 23 is arranged into the slits located in the middle portion of the current measuring conductor 10.

As illustrated in FIG. 4A, the current measuring conductor 10 of Case 1 includes the two current paths 13 and 14 having widths different from each other. The width of the current path 13 is 4.5 mm and the width of the current path 14 is 2.5 mm. In addition, the distance C is 4.5 mm, and the distance D is 3.5 mm. Therefore, a length of the gap 15 disposed between the two current paths 13 and 14 (C+D) is 8 mm. The current measuring conductor 10 of Case 1 has an asymmetrical shape.

As illustrated in FIG. 4B, the current measuring conductor 10a of Case 2 includes the two current paths 13 and 14 having same widths. The width of the current path 13 is 3.5 mm and the width of the current path 14 is 3.5 mm. In addition, the distance C is 4.5 mm, and the distance D is 4.5 mm. Therefore, the length of the gap 15 disposed between the two current paths 13 and 14 (C+D) is 9 mm. The current measuring conductor 10a of Case 2 has a line-symmetrical shape.

As illustrated in FIG. 4C, the current measuring conductor 10b of Case 3 includes the two current paths 13 and 14 having same widths. The width of the current path 13 is 2.5 mm and the width of the current path 14 is 2.5 mm. In addition, the distance C is 4.5 mm, and the distance D is 4.5 mm. Therefore, the length of the gap 15 disposed between the two current paths 13 and 14 (C+D) is 9 mm. The current measuring conductor 10b of Case 3 has a line-symmetrical shape.

Figure 5:
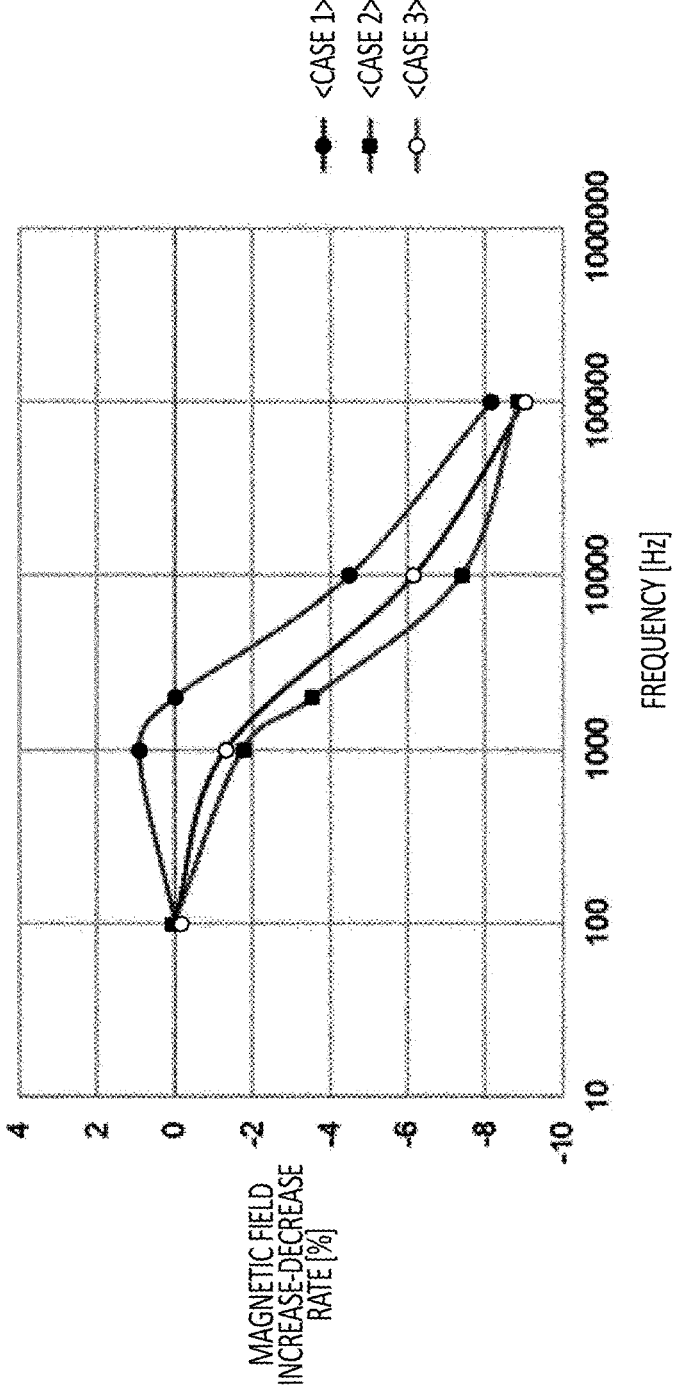
FIG. 5 is a graph illustrating a relationship between frequency (Hz: horizontal axis) and magnetic field increase-decrease rate (%: vertical axis) for each of the current measuring conductors of Case 1 to Case 3.

FIG. 5 is a graph illustrating a relationship between frequency (Hz: horizontal axis) and magnetic field increase-decrease rate in positions of the magnetic field sensing elements 22 and 23 with respect to 100 Hz (%: vertical axis) for each of the current measuring conductors of Case 1 to Case 3. Detection accuracy of a magnetic field increases when it does not depend on a frequency as possible, that is, it is desired that the magnetic field increase-decrease rate is near zero in any frequency band. In FIG. 5, Case 1 is indicated by black dots, Case 2 is indicated by squares, and Case 3 is indicated by white dots.

In the current measuring conductor 10 illustrated in Case 1, a rising rate of the magnetic field is suppressed at frequencies of around 1,000 Hz, and the increase-decrease rate of the magnetic field is suppressed at frequencies of around 10,000 to 100,000 Hz. Therefore, in the low-frequency band and the high-frequency band, good results are yielded.

In the current measuring conductor 10a illustrated in Case 2, the magnetic field significantly attenuates at frequencies of around 1,000 Hz, and the magnetic field significantly attenuates also at frequencies of around 10,000 to 100,000 Hz. Therefore, in the low-frequency band and the high-frequency band, the magnetic field attenuates.

In the current measuring conductor 10b illustrated in Case 3, the increase-decrease rate of the magnetic field is suppressed at frequencies of around 1,000 Hz, whereas the magnetic field significantly attenuates at frequencies of around 10,000 to 100,000 Hz. Therefore, particularly in the high-frequency band, the magnetic field attenuates.

FIG. 6 is a table representing a maximum temperature during applying a direct current of 1,000 A and a magnetic flux density during applying a direct current of 1,000 A for the current measuring conductors of Case 1 to Case 3. The maximum temperature during applying the current is a temperature measured at the portion of the current path 14 of the current measuring conductors. Note that, from the perspective of durability and influences on other elements, it is desired that the maximum temperature during applying the current is low. In addition, it is desired that the magnetic flux density during applying the current is high, and due to this high magnetic flux density, the gain when detecting magnetism can be suppressed.

As illustrated in FIG. 6, the maximum temperature during applying the current is 592° C. in the current measuring conductor 10 in the first embodiment illustrated in Case 1, 675° C. in the current measuring conductor 10a in the first comparative example illustrated in Case 2, and 757° C. in the current measuring conductor 10b in the second comparative example illustrated in Case 3. In this manner, the current measuring conductor 10 in the first embodiment can suppress the maximum temperature during applying the current compared to the current measuring conductors 10a and 10b in the comparative examples.

As illustrated in FIG. 6, the magnetic flux density during applying the current is 0.745 mT in the current measuring conductor 10 in the first embodiment illustrated in Case 1, 0.639 mT in the current measuring conductor 10a in the first comparative example illustrated in Case 2, and 0.723 mT in the current measuring conductor 10b in the second comparative example illustrated in Case 3. In this manner, the current measuring conductor 10 in the first embodiment can detect a higher magnetic flux density during applying the current compared to the current measuring conductors 10a and 10b in the comparative examples.

From the above results, it is found that, among the current measuring conductors of Case 1 to Case 3, the current measuring conductor 10 of Case 1 has a better durability and magnetic flux density compared to the current measuring conductors 10a and 10b of Case 2 and Case 3. Therefore, it is found that, by including the current path 13 having the larger width and the current path 14 having the smaller width, the durability and the magnetic flux density increase compared to the embodiment including two current paths 13 and 14 having same widths. Note that it is desired that a ratio of the width (or cross-sectional area) of the current path 14 having the smaller width relative to the width (or cross-sectional area) of the current path 13 having the larger width is within a range from 5:6 to 5:11.

Figure 7A:
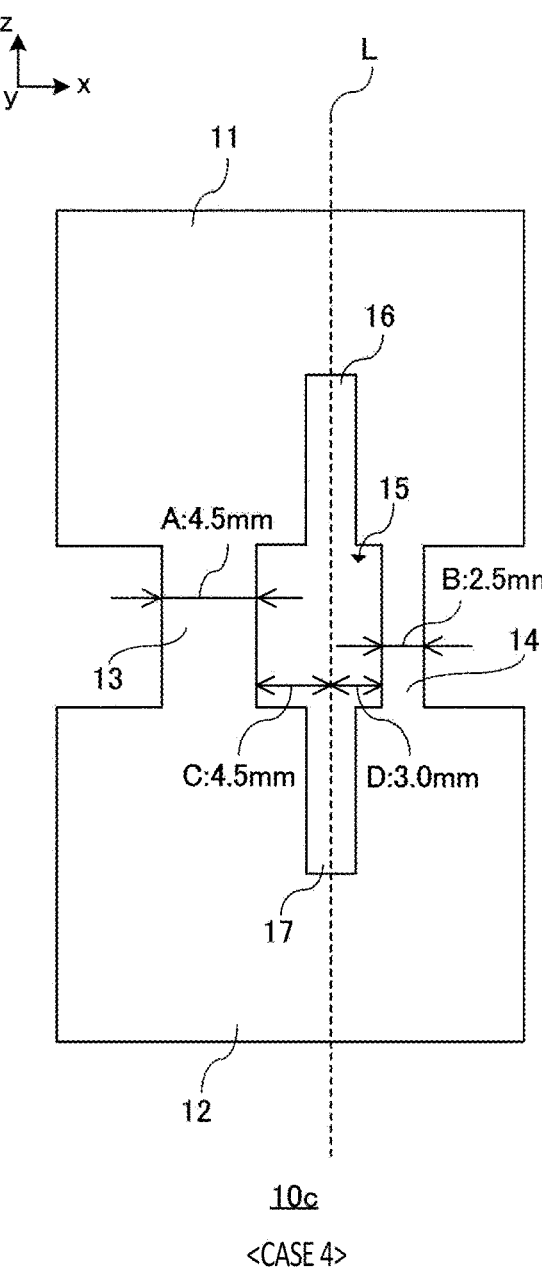
FIG. 7A represents a current measuring conductor of Case 4.
Figure 7B:
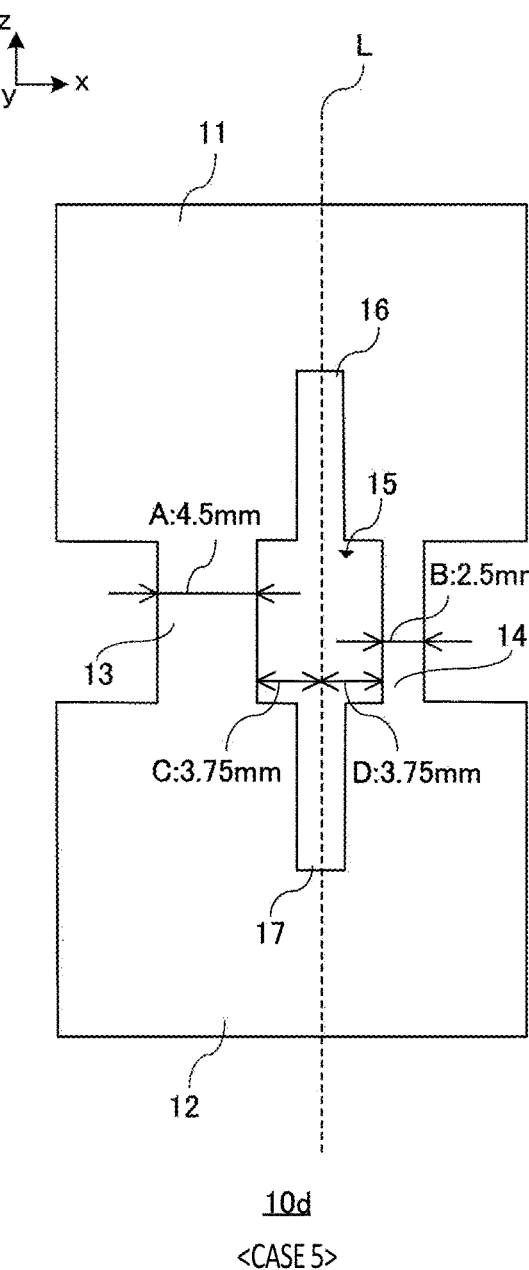
FIG. 7B represents a current measuring conductor of Case 5.
Figure 7C:
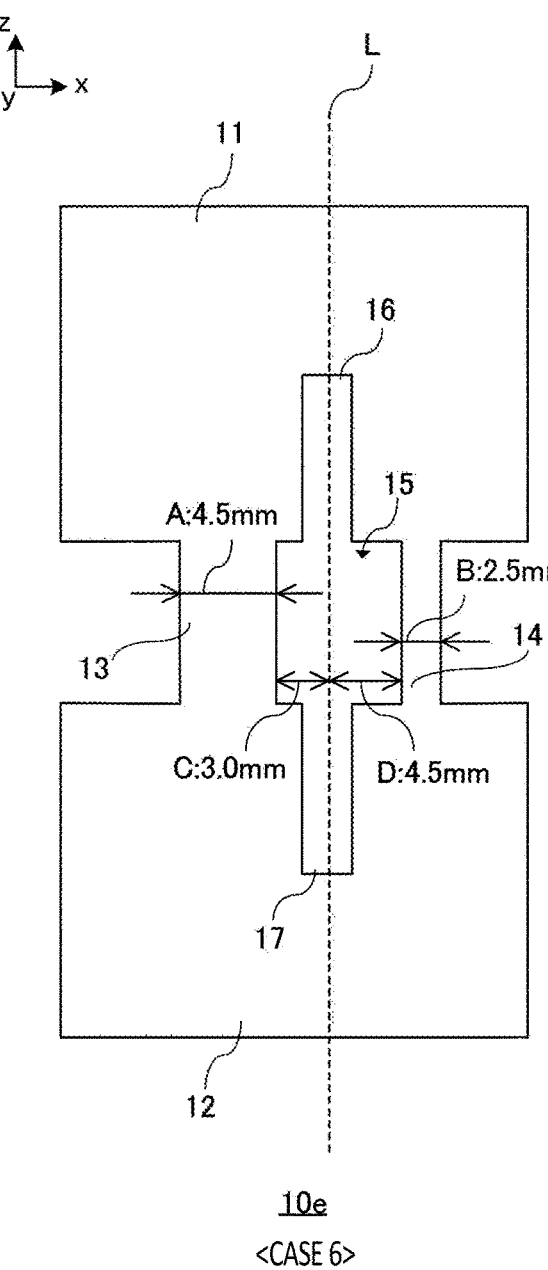
FIG. 7C represents a current measuring conductor of Case 6.

FIGS. 7A to 7C represent current measuring conductors of Case 4 to Case 6. Case 4 represents a schematic configuration of a current measuring conductor 10c in a third comparative example, Case 5 represents a schematic configuration of a current measuring conductor 10d in a fourth comparative example, and Case 6 represents a schematic configuration of a current measuring conductor 10e in a fifth comparative example. Although not illustrated in FIGS. 7A to 7C, in all of the cases, the substrate 20 equipped with the two magnetic field sensing elements 22 and 23 is arranged into the slits located in the middle portion of the current measuring conductor. The two magnetic field sensing elements 22 and 23 are arranged so as to be positioned on the dashed line L.

As illustrated in FIG. 7A, in the current measuring conductor 10c of Case 4, the distance between the two magnetic field sensing elements 22 and 23 and the inner end of the current path 13 is 4.5 mm, and the distance between the two magnetic field sensing elements 22 and 23 and the inner end of the current path 14 is 2.5 mm. That is, the two magnetic field sensing elements 22 and 23 are arranged so as to be closer to the current path 14 having the smaller width.

As illustrated in FIG. 7B, in the current measuring conductor 10d of Case 5, the distance between the two magnetic field sensing elements 22 and 23 and the inner end of the current path 13 is 3.75 mm, and the distance between the two magnetic field sensing elements 22 and 23 and the inner end of the current path 14 is 3.75 mm. That is, the two magnetic field sensing elements 22 and 23 are arranged in the middle between the current path 13 and the current path 14.

As illustrated in FIG. 7C, in the current measuring conductor 10e of Case 6, the distance between the two magnetic field sensing elements 22 and 23 and the inner end of the current path 13 is 3.0 mm, and the distance between the two magnetic field sensing elements 22 and 23 and the inner end of the current path 14 is 4.5 mm. That is, the two magnetic field sensing elements 22 and 23 are arranged so as to be closer to the current path 13 having the larger width.

Figure 8:
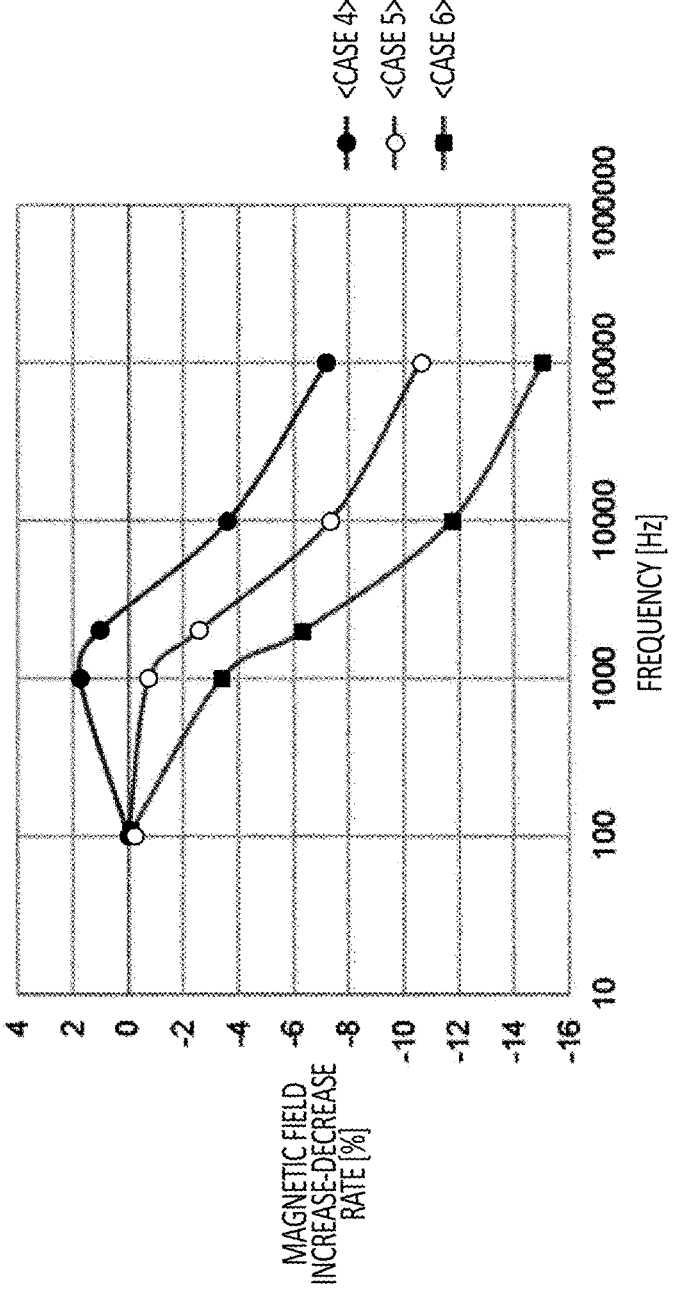
FIG. 8 is a graph illustrating a relationship between frequency (Hz: horizontal axis) and magnetic field increase-decrease rate (%: vertical axis) for each of the current measuring conductors of Case 4 to Case 6.

FIG. 8 is a graph illustrating a relationship between frequency (Hz: horizontal axis) and magnetic field increase-decrease rate (%: vertical axis) for each of the current measuring conductors of Case 4 to Case 6. In FIG. 8, it is desired that the magnetic field increase-decrease rate is near zero in any frequency band. In FIG. 8, Case 4 is indicated by black dots, Case 5 is indicated by white dots, and Case 6 is indicated by squares.

In the current measuring conductor 10c in the third comparative example illustrated in Case 4, the rising rate of the magnetic field is suppressed at frequencies of around 1,000 Hz, and the increase-decrease rate of the magnetic field is suppressed at frequencies of around 10,000 to 100,000 Hz. Therefore, in the low-frequency band and the high-frequency band, good results are yielded.

In the current measuring conductor 10d in the fourth comparative example illustrated in Case 5, the rising rate of the magnetic field is suppressed at frequencies of around 1,000 Hz, whereas the magnetic field significantly attenuates at frequencies of around 10,000 to 100,000 Hz. Therefore, particularly in the high-frequency band, the increase-decrease rate of the magnetic field is not suppressed, which is undesirable.

In the current measuring conductor 10e in the fifth comparative example illustrated in Case 6, the magnetic field significantly attenuates at frequencies of around 1,000 Hz, and the magnetic field significantly attenuates also at frequencies of around 10,000 to 100,000 Hz. Therefore, in the low-frequency band and the high-frequency band, the increase-decrease rate of the magnetic field is not suppressed, which is undesirable.

From the above results of the current measuring conductors of Case 4 to Case 6, it is found that, when the two magnetic field sensing elements 22 and 23 are arranged so as to be closer to the current path 14 having the smaller width, the increase-decrease rate of the magnetic field is suppressed and good results are yielded. Note that it is desired that a ratio of the distance between the two magnetic field sensing elements 22 and 23 and the inner end of the current path 14 having the smaller width to the distance between the two magnetic field sensing elements 22 and 23 and the inner end of the current path 13 having the larger width is within a range from 6:7 to 6:11.

Figure 9A:
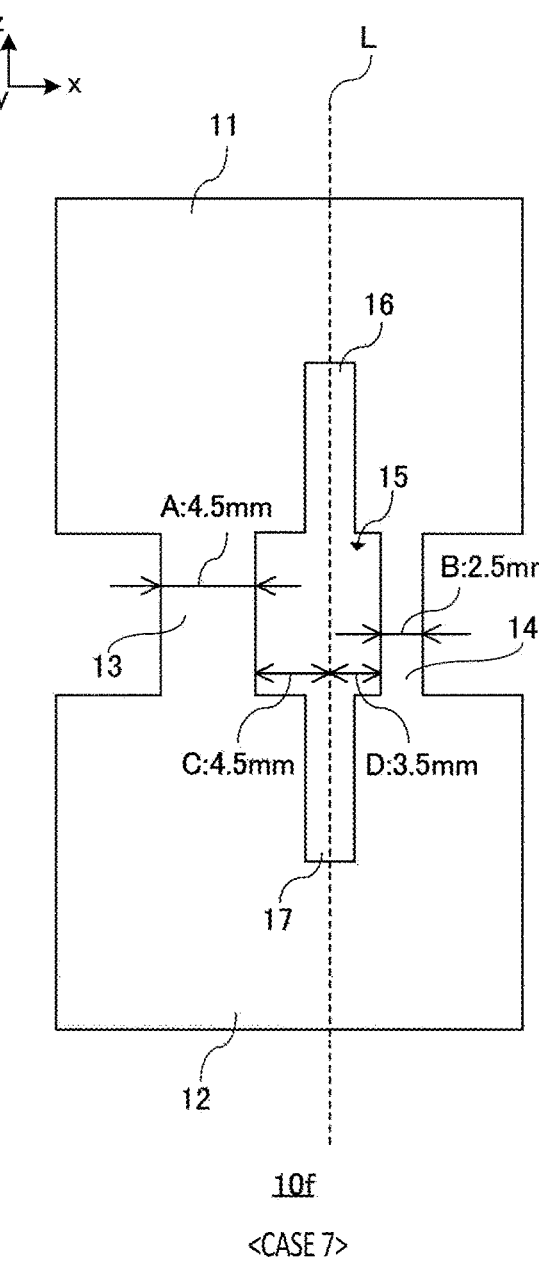
FIG. 9A represents a current measuring conductor of Case 7.
Figure 9B:
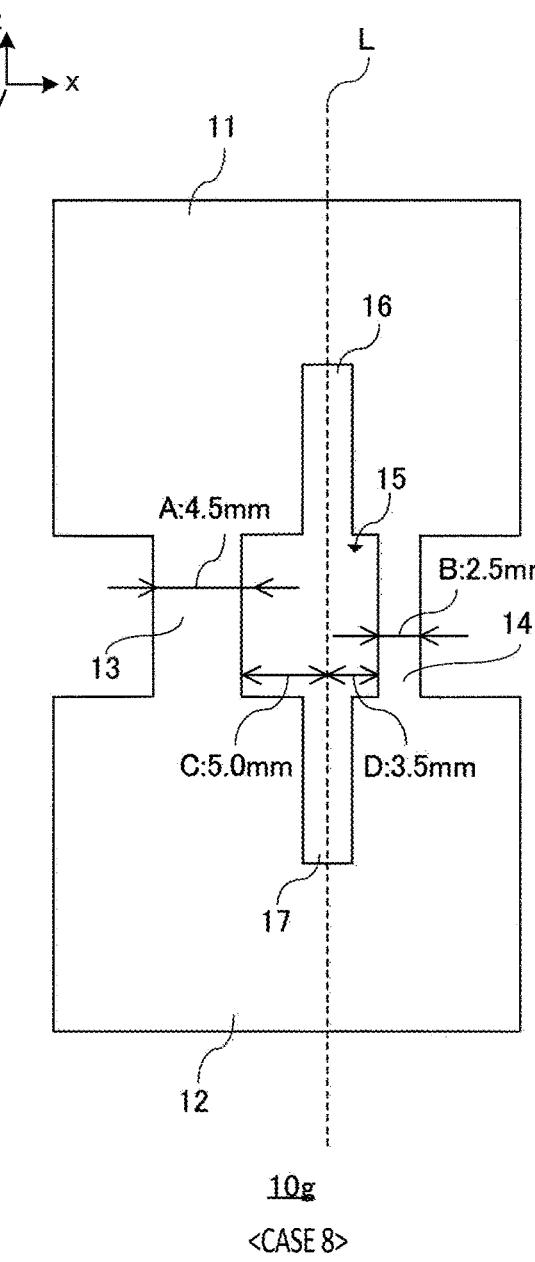
FIG. 9B represents a current measuring conductor of Case 8.

FIGS. 9A and 9B represent current measuring conductors from Case 7 to Case 8. Case 7 represents a schematic configuration of a current measuring conductor 10f in a sixth comparative example, and Case 8 represents a schematic configuration of a current measuring conductor 10g in a seventh comparative example. Although not illustrated in FIGS. 9A and 9B, in all of the cases, the substrate 20 equipped with the two magnetic field sensing elements 22 and 23 is arranged into the slits located in the middle portion of the current measuring conductor. The two magnetic field sensing elements 22 and 23 are arranged so as to be positioned on the dashed line L.

As illustrated in FIG. 9A, in the current measuring conductor 10f of Case 7, the distance between the two magnetic field sensing elements 22 and 23 and the inner end of the current path 13 is 4.5 mm, and the distance between the two magnetic field sensing elements 22 and 23 and the inner end of the current path 14 is 3.5 mm. The two magnetic field sensing elements 22 and 23 are arranged so as to be closer to the current path 14 having the smaller width. In addition, the width of the gap 15 is 4.5+3.5=8 mm.

As illustrated in FIG. 9B, in the current measuring conductor 10g of Case 8, the distance between the two magnetic field sensing elements 22 and 23 and the inner end of the current path 13 is 5.0 mm, and the distance between the two magnetic field sensing elements 22 and 23 and the inner end of the current path 14 is 3.5 mm. In addition, the width of the gap 15 is 5.0+3.5=8.5 mm. In the current measuring conductor 10g of Case 8, the distance between the two magnetic field sensing elements 22 and 23 and the inner end of the current path 13 having the thicker width is 0.5 mm larger than that in the current measuring conductor 10f of Case 7.

Figure 10:
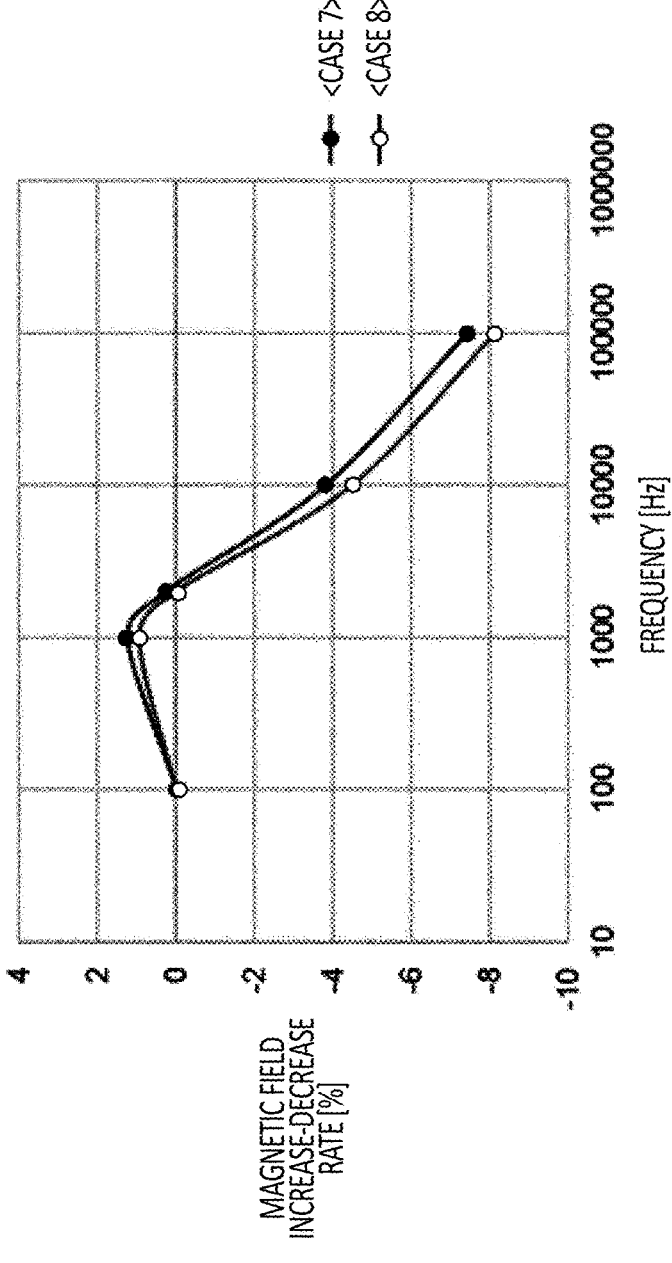
FIG. 10 is a graph illustrating a relationship between frequency (Hz: horizontal axis) and magnetic field increase-decrease rate (%: vertical axis) for the current measuring conductors of Case 7 and Case 8.

FIG. 10 is a graph illustrating a relationship between frequency (Hz: horizontal axis) and magnetic field increase-decrease rate (%: vertical axis) for each of the current measuring conductors of Case 7 and Case 8. In FIG. 10, it is desired that the magnetic field increase-decrease rate is near zero in any frequency band. In FIG. 10, Case 7 is indicated by black dots, and Case 8 is indicated by white dots.

As illustrated in FIG. 10, the rising rate of the magnetic field in the current measuring conductor 10g of Case 8 is suppressed at frequencies of around 1,000 Hz more greatly than that in the current measuring conductor 10f of Case 7, and the increase-decrease rate of the magnetic field in the current measuring conductor 10f of Case 7 is suppressed at frequencies of around 10,000 to 100,000 Hz more greatly than that in the current measuring conductor 10g of Case 8.

From the above, it is found that the magnetic field increase-decrease rate for a current measuring conductor at a frequency varies depending on the distance between the current measuring conductor and the two magnetic field sensing elements 22 and 23.

Effects of First Embodiment

According to the current measurement module 100 in the first embodiment, the two main body portions 11 and 12 of the current measuring conductor 10 have the current path 13 having the larger width and the current path 14 having the smaller width, and the two magnetic field sensing elements 22 and 23 are arranged so as to be closer to the current path 14 having the smaller width. The above-described configuration allows the current measurement module 100 to be designed to have optimal values of the exothermic characteristics, the frequency characteristics, and the magnetic characteristics.

According to the current measurement module 100 in the first embodiment, the two main body portions 11 and 12 have the slits 16 and 17, respectively, and the substrate 20 supporting the two magnetic field sensing elements 22 and 23 is inserted into and fixed to the slits 16 and 17. As a result, the magnitudes of the currents to be measured flowing through the two current paths 13 and 14 can be measured with a simple configuration. In addition, the substrate 20 may be fixed by contacting it with edges of the gap 15 and the two slits 16 and 17. According to the above-described configuration, it is easier to position or fix the substrate 20, and in turn, to position the magnetic field sensing elements 22 and 23 supported on the substrate 20.

Second Embodiment

Figure 11A:
FIG. 11A is a top view illustrating an example of a schematic configuration of a current measuring conductor 10*h* in the second embodiment.
Figure 11A:
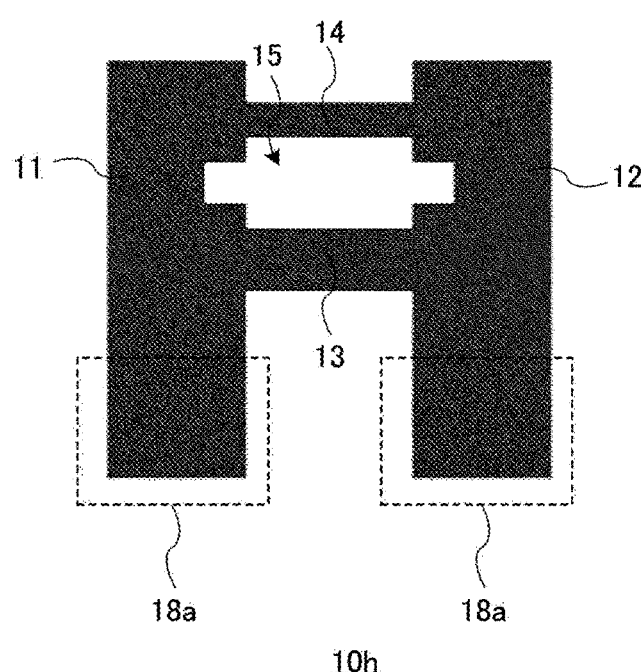
Figure 11B:
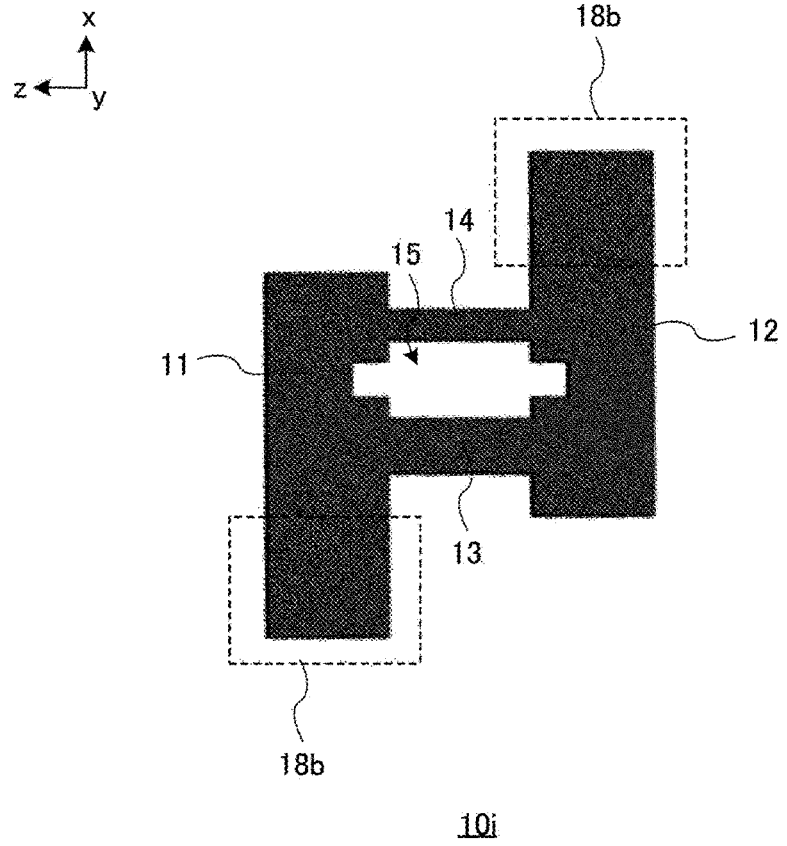
FIG. 11B is a top view illustrating an example of a schematic configuration of a current measuring conductor 10*i* in the second embodiment.

FIGS. 11A and 11B are top views illustrating an example of a schematic configuration of a current measuring conductor 10h and 10i in the second embodiment, respectively. As illustrated in FIGS. 11A and 11B, the current measuring conductors 10h and 10i include two main body portions 11 and 12 and two current paths 13 and 14. The two current paths 13 and 14 are disposed between the two main body portions 11 and 12 and extend in parallel to each other. A gap 205 is disposed between the two current paths 13 and 14. Although not illustrated, similar to the first embodiment, two magnetic field sensing elements 22 and 23 is arranged so as to be closer to the current path 14 having the smaller width.

A current to be measured flows through each of the two current paths 13 and 14 in a same direction. In the present embodiment, the two current paths 13 and 14 are conductors having a transverse cross-sectional shape of rectangular and extending linearly. Note that the two current paths 13 and 14 may be configured as conductors having a transverse cross-sectional shape of circular and having a linear shape as a whole.

As illustrated in FIG. 11A, each of the two main body portions 11 and 12 includes one of two extending portions 18a (first extending portions) obtained by extending the two main body portions 11 and 12 in a direction (x direction) orthogonal to a direction in which currents flow through the two current paths 13 and 14 (z direction). The two extending portions 18a extend in the same direction. That is, the main body portion 11 includes the extending portion 18a obtained by extending the main body portion 11 in a −x direction, and the main body portion 12 includes the extending portion 18a obtained by extending the main body portion 12 in a −x direction.

As illustrated in FIG. 11B, each of the two main body portions 11 and 12 includes one of two extending portions 18b (first extending portions) obtained by extending the two main body portions 11 and 12 in the direction (x direction) orthogonal to the direction in which currents flow through the two current paths 13 and 14 (z direction). The two extending portions 18b extend in different directions to each other. That is, the main body portion 11 includes the extending portion 18b obtained by extending the main body portion 11 in the −x direction, and the main body portion 12 includes the extending portion 18b obtained by extending the main body portion 12 in the +x direction.

By the two main body portions 11 and 12 including the extending portions 18a or the extending portions 18b, the current measuring conductors 10h and 10i can be fixed to a device in which the current measuring conductors 10h and 10i are to be implemented just by connecting and fix extending portions 18a and 18b to terminals of the device, thereby achieving a structure considering ease of the assembly.

Effects of Second Embodiment

According to the current measuring conductors 10h and 10i in the second embodiment, a similar effect as the current measurement module 100 in the first embodiment can be achieved.

According to the current measuring conductors 10h and 10i in the second embodiment, the two main body portions 11 and 12 including the extending portions 18a or the extending portions 18b can achieve a structure considering ease of the assembly.

Third Embodiment

FIGS. 12A to 12E are perspective views illustrating an example of a schematic configuration of current measuring conductors 10j to 10n according to a third embodiment, respectively. A current measuring conductor 10j illustrated in FIG. 12A has a basic configuration of the current measuring conductor 10i illustrated in FIG. 11B. The current measuring conductor 10j further includes an extending portion 19a (second extending portion) further extending from the extending portion 18b of the current measuring conductor 10i, and the extending portion 19a extends in a direction (y direction) orthogonal to a plane in which the two main body portions 11 and 12 are arranged (x-z plane).

Figure 12A:
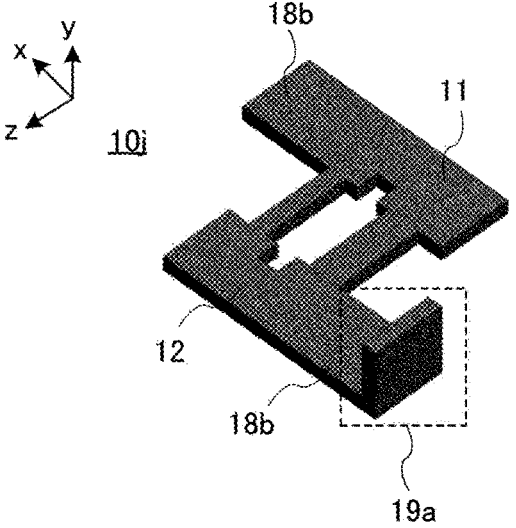
FIG. 12A is a perspective view illustrating an example of a schematic configuration of a current measuring conductor 10*j* in a third embodiment.
Figure 12B:
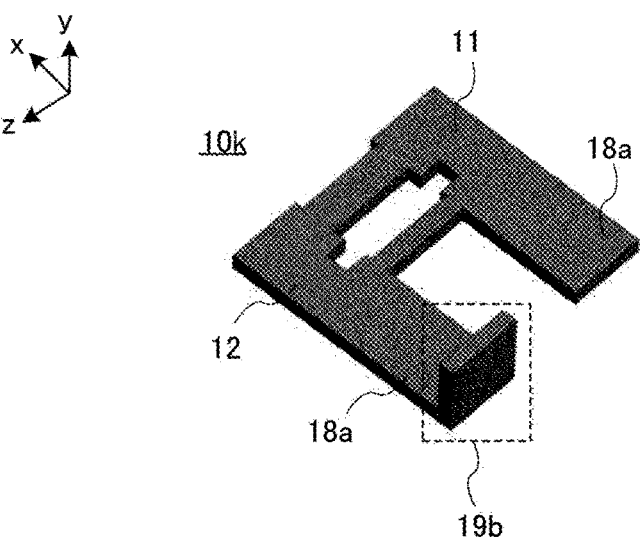
FIG. 12B is a perspective view illustrating an example of a schematic configuration of a current measuring conductor 10*k* in the third embodiment.

A current measuring conductor 10k illustrated in FIG. 12B has a basic configuration of the current measuring conductor 10h illustrated in FIG. 11A. The current measuring conductor 10k further includes an extending portion 19b (second extending portion) further extending from the extending portion 18a of the current measuring conductor 10h, and the extending portion 19b extends in the direction (y direction) orthogonal to the plane in which the two main body portions 11 and 12 are arranged (x-z plane).

Figure 12C:
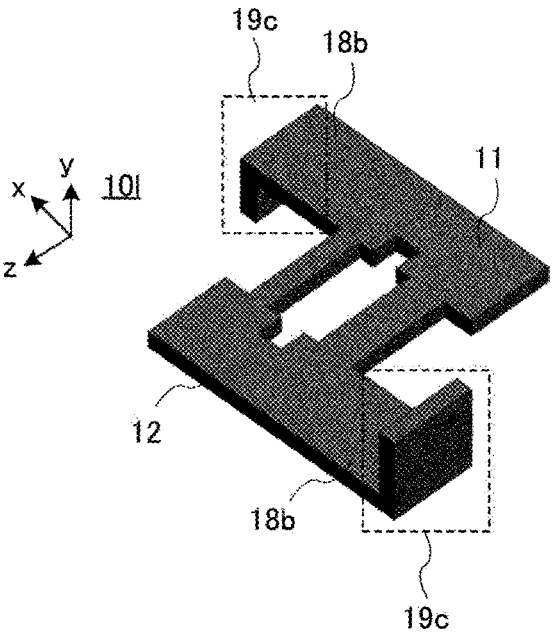
FIG. 12C is a perspective view illustrating an example of a schematic configuration of a current measuring conductor 10*l* in the third embodiment.

A current measuring conductor 10l illustrated in FIG. 12C has a basic configuration of the current measuring conductor 10i illustrated in FIG. 11B. The current measuring conductor 10l further includes two extending portions 19c (second extending portions) further extending from the two extending portions 18b of the current measuring conductor 10i, and the extending portions 19c extend in the direction (y direction) orthogonal to the plane in which the two main body portions 11 and 12 are arranged (x-z plane). The two extending portions 19c extend in opposite directions.

Figure 12D:
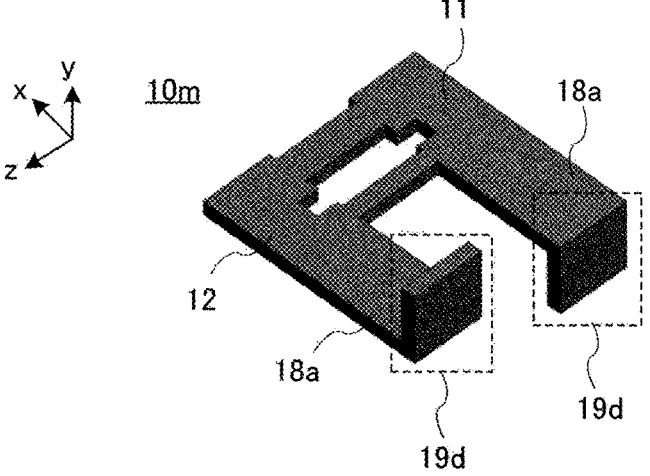
FIG. 12D is a perspective view illustrating an example of a schematic configuration of a current measuring conductor 10*m* in the third embodiment.

A current measuring conductor 10m illustrated in FIG. 12D has a basic configuration of the current measuring conductor 10h illustrated in FIG. 11A. The current measuring conductor 10m further includes two extending portions 19d (second extending portions) further extending from the two extending portions 18a of the current measuring conductor 10h, and the extending portions 19d extend in the direction (y direction) orthogonal to the plane in which the two main body portions 11 and 12 are arranged (x-z plane). The two extending portions 19d extend in opposite directions.

Figure 12E:
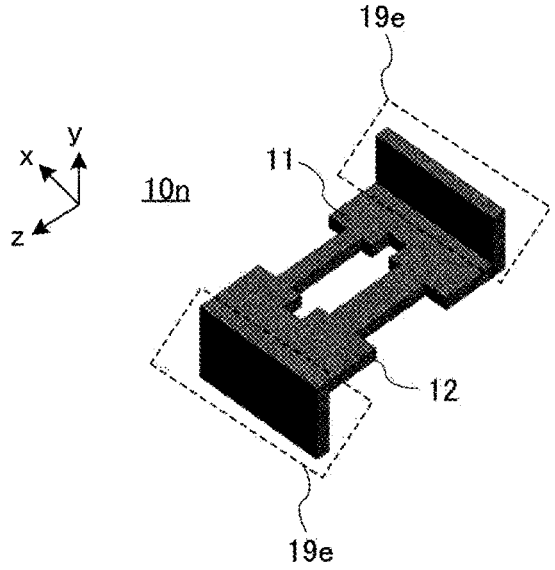
FIG. 12E is a perspective view illustrating an example of a schematic configuration of a current measuring conductor 10*n* in the third embodiment.

A current measuring conductor 10n illustrated in FIG. 12E has a basic configuration of the current measuring conductor 10 illustrated in FIG. 2. The current measuring conductor 10n further includes two extending portions 19e further extending from the two main body portions 11 and 12, and the extending portions 19e extend in the direction (y direction) orthogonal to the plane in which the two main body portions 11 and 12 are arranged (x-z plane). The two extending portions 19e extend in opposite directions.

Effects of Third Embodiment

According to the current measuring conductors 10j to 10n in the third embodiment, a similar effect as the current measurement module 100 in the first embodiment can be achieved.

According to the current measuring conductors 10j to 10n in the third embodiment, by having the extending portions 19a to 19e extending in the direction (y direction) orthogonal to the plane in which the two main body portions 11 and 12 are arranged (x-z plane), a structure considering ease of the assembly can be achieved.

Other Embodiments

In the first to the third embodiments described above, the two current paths 13 and 14 have same thicknesses and different widths. However, the two current paths 13 and 14 are only required to have different cross-sectional areas to each other, for example, may have same widths and different thicknesses. In this case, the thickness of the current path 13 may be greater than the thickness of the current path 14. In addition, the two current paths 13 and 14 may also have different widths and different thicknesses. In this case, the width of the current path 13 may be greater than the width of the current path 14, and the thickness of the current path 13 may be greater than the thickness of the current path 14.

In the first to the third embodiments described above, any of the current measuring conductors is fabricated, for example, by stamping a copper plate. Note that instead of this, it may be made of aluminum.

Figure 13A:
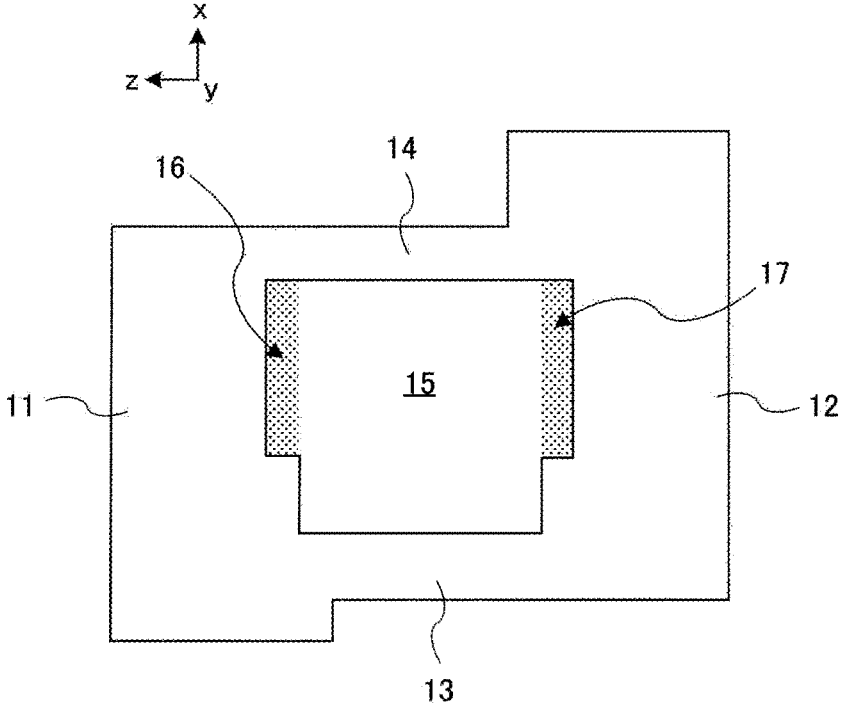
FIG. 13A is a top view illustrating an example of a schematic configuration of a current measuring conductor 10*o* in another embodiment.
Figure 13B:
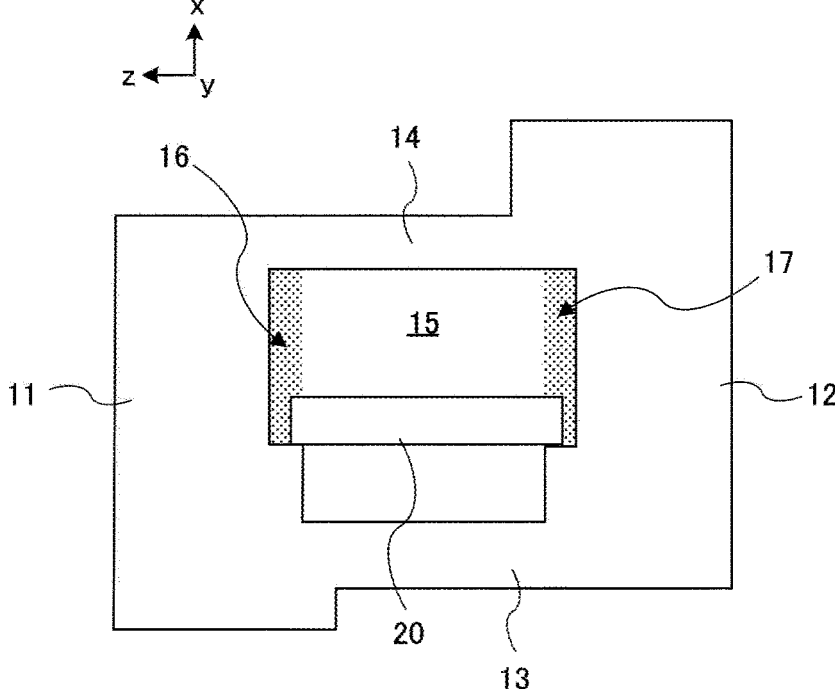
FIG. 13B is a top view illustrating an example of a schematic configuration of a current measuring conductor 10*o* in the another embodiment.

FIGS. 13A and 13B are top views illustrating an example of a schematic configuration of a current measuring conductor 10o in another embodiment. FIG. 13A illustrates a current measuring conductor 10o before being inserted into the substrate 20, and FIG. 13B illustrates the current measuring conductor 10o after being inserted into the substrate 20. In FIGS. 13A and 13B, two slits 16 and 17 is indicated by gray hatching. As illustrated in FIG. 13A, the gap 15 of the current measuring conductor 10o and the two slits 16 and 17 constitute an opening having a t-shape. As illustrated in FIG. 13B, the substrate 20 is positioned so as to be contacted with edges of the gap 15 and the two slits 16 and 17. Due to the configurations of current measuring conductor 10o illustrated in FIGS. 13A and 13B, it is easier to position or fix the substrate 20, and in turn, to position the magnetic field sensing elements 22 and 23 supported on the substrate 20.

While the present invention has been described by way of the embodiments, the technical scope of the present invention is not limited to the above-described embodiments. It is apparent to persons skilled in the art that various modifications or improvements can be made to the above-described embodiments. It is also apparent from the description of the claims that the embodiments to which such modifications or improvements are made can be included in the technical scope of the present invention.

It should be noted that each process of the operations, procedures, steps, stages, and the like performed by the apparatus, system, program, and method shown in the claims, specification, or drawings can be executed in any order as long as the order is not indicated by "prior to", "before", or the like and as long as the output from a previous process is not used in a later process. Even if the operation flow is described using phrases such as "first" or "next" for the sake of convenience in the claims, specification, or drawings, it does not necessarily mean that the process must be performed in this order.

EXPLANATION OF REFERENCES 10, 10a to 100: current measuring conductor;
11: main body portion;
12: main body portion;
13: current path;
14: current path;
15: gap;
16: slit;
17: slit;
18a, 18b: extending portion;
19a to 19e: extending portion;
20: substrate;
21: package;
22: magnetic field sensing element;
23: magnetic field sensing element;
24: fixing portion;
25: fixing portion;
100: current measurement module.

What is claimed is:

1. A current measurement module comprising:
a conductor integrally formed as a single plate body comprising two main body portions and two current paths connected to the main body portions, wherein the two current paths are disposed between the two main body portions and extend in parallel to each other with a gap provided therebetween, the gap surrounded by the two current paths and portions of the two main body portions;
two magnetic field sensing elements which each have a magnetosensitive surface disposed such that magnetic fields generated by currents flowing through the two current paths penetrate through the magnetosensitive surface in opposite directions to each other; and
a substrate which supports the two magnetic field sensing elements and is attached to the conductor, wherein the substrate is inserted into the gap, and
a distance between the two magnetic field sensing elements and an inner end of a current path of the two current paths having a smaller cross-sectional area is smaller than a distance between the two magnetic field sensing elements and an inner end of a current path of the two current paths having a larger cross-sectional area.

2. The current measurement module according to claim 1, wherein each of the two current paths is disposed farther inward than outer edges of the two main body portions in a direction in which the two current paths are aligned.

3. The current measurement module according to claim 1, wherein the two main body portions comprise slits, respectively, which extend from the gap and are narrower than the gap.

4. The current measurement module according to claim 3, wherein each of the slits have a tapered portion tapering from a side adjacent to the two current paths to a side adjacent to the two main body portions.

5. The current measurement module according to claim 3, wherein the substrate is inserted into the gap and the slits.

6. The current measurement module according to claim 3, wherein the substrate is inserted into the gap and the slits, and at least a part of the substrate contacts with an edge of each of the slits.

7. The current measurement module according to claim 3, wherein the slits are disposed farther inward than outer edges of the gap in a direction in which the two current paths are aligned.

8. The current measurement module according to claim 3, wherein the gap and the slits constitute an opening having a T-shape.

9. The current measurement module according to claim 1, wherein the two magnetic field sensing elements are arranged on a surface on the substrate facing the current path having the smaller cross-sectional area.

10. The current measurement module according to claim 1, wherein each of the two main body portions comprises a first extending portion extending in a direction orthogonal to a direction in which currents flow through the two current paths.

11. The current measurement module according to claim 10, wherein the first extending portion of each of the two main body portions extends in opposite directions to each other.

12. The current measurement module according to claim 10, wherein at least one of the two main body portions further comprises a second extending portion further extending from the first extending portions, and the second extending portion extends in a direction orthogonal to a plane in which the two main body portions are arranged.

13. The current measurement module according to claim 1, wherein the two current paths have same thicknesses and different widths.

14. The current measurement module according to claim 1, wherein a ratio of the distance between the two magnetic field sensing elements and the inner end of the current path having the smaller cross-sectional area to the distance between the two magnetic field sensing elements and the inner end of the current path having the larger cross-sectional area is within a range from 6:7 to 6:11.

15. The current measurement module according to claim 1, wherein a ratio of a cross-sectional area of the current path having the smaller cross-sectional area to a cross-sectional area of the current path having the larger cross-sectional area is within a range from 5:6 to 5:11.

* * * * *